United States Patent
Hausler

(10) Patent No.: US 11,415,533 B2
(45) Date of Patent: Aug. 16, 2022

(54) METHOD FOR AUTOMATICALLY QUANTIFYING AN ANALYTE, AND NMR MEASURING DEVICE FOR CARRYING OUT THE METHOD

(71) Applicant: Robert Bosch GmbH, Stuttgart (DE)

(72) Inventor: Thomas Hausler, Polling (DE)

(73) Assignee: Robert Bosch GmbH, Stuttgart (DE)

( * ) Notice: Subject to any disclaimer, the term of this patent is extended or adjusted under 35 U.S.C. 154(b) by 278 days.

(21) Appl. No.: 16/623,695

(22) PCT Filed: May 16, 2018

(86) PCT No.: PCT/EP2018/062715
§ 371 (c)(1),
(2) Date: Dec. 17, 2019

(87) PCT Pub. No.: WO2019/001835
PCT Pub. Date: Jan. 3, 2019

(65) Prior Publication Data
US 2020/0158668 A1 May 21, 2020

(30) Foreign Application Priority Data
Jun. 26, 2017 (DE) ...................... 10 2017 210 700.6

(51) Int. Cl.
*G01N 24/08* (2006.01)
*G01R 33/46* (2006.01)
*G01R 33/38* (2006.01)

(52) U.S. Cl.
CPC ......... *G01N 24/08* (2013.01); *G01R 33/4625* (2013.01); *G01R 33/4633* (2013.01); *G01R 33/3808* (2013.01)

(58) Field of Classification Search
CPC ................ G01N 24/08; G01R 33/4625; G01R 33/4633; G01R 33/3808
See application file for complete search history.

(56) References Cited

U.S. PATENT DOCUMENTS

| | | | |
|---|---|---|---|
| 6,027,941 A | 2/2000 | Jarvie et al. | |
| 2004/0082075 A1* | 4/2004 | Powers | G01N 24/08 436/173 |

(Continued)

FOREIGN PATENT DOCUMENTS

| | | |
|---|---|---|
| CN | 106796189 A | 5/2017 |
| DE | 101 19 455 A1 | 10/2002 |

(Continued)

OTHER PUBLICATIONS

International Search Report corresponding to PCT Application No. PCT/EP2018/062715, dated Sep. 18, 2018 (German and English language document) (7 pages).

(Continued)

*Primary Examiner* — Susan S Lee
(74) *Attorney, Agent, or Firm* — Maginot, Moore & Beck LLP

(57) ABSTRACT

A method for automatically quantifying an analyte in a measurement sample includes providing a 1D-NMR spectrum and a 2D-NMR spectrum, providing at least one information item in relation to at least one analyte to be quantified, establishing a chemical shift of the NMR signal of the analyte to be quantified from the measured 2D-NMR spectrum using the at least one information item provided, establishing expected peak positions of the NMR signal of the analyte to be quantified, establishing measured peak positions from the measured 1D-NMR spectrum, and establishing disturbance signal peak positions using the expected peak positions and the actual peak positions. The method further includes modelling the 1D-NMR spectrum using the established disturbance signal peak positions using the established chemical shift and using the at least one information item provided, integrating the modelled 1D-NMR (Continued)

spectrum, and quantifying the analyte by internal or external referencing.

17 Claims, 7 Drawing Sheets

(56) References Cited

U.S. PATENT DOCUMENTS

| | | | |
|---|---|---|---|
| 2014/0343873 A1 | | 11/2014 | Brüschweiler et al. |
| 2017/0356865 A1* | | 12/2017 | Takis ............... G01N 24/08 |

FOREIGN PATENT DOCUMENTS

| | | |
|---|---|---|
| DE | 601 10 057 T2 | 9/2005 |
| DE | 10 2014 203 721 A1 | 9/2015 |
| DE | 10 2014 218 371 A1 | 3/2016 |
| DE | 10 2014 218 375 A1 | 3/2016 |
| JP | 2000-147081 A | 5/2000 |
| JP | 2000-510243 A | 8/2000 |
| JP | 2010-249746 A | 11/2010 |

OTHER PUBLICATIONS

Hao, J. et al., Bayesian deconvolution and quantification of metabolites in complex 1D NMR spectra using BATMAN, Nature Protocols, vol. 9, No. 6, May 22, 2014, pp. 1416-1427, XP055333942.

Tardieu, A. et al., Using one-dimensional (1D) and two-dimensional (2D) quantitative proton (1H) nuclear magnetic resonance spectroscopy (qNMR) for the identification and quantification of taste compounds in raw onion (*Allium cepa* L.) bulbs and in aqueous solutions where onion tissues are soaked, Analytical and Bioanalytical Chemistry, vol. 398, No. 7-8, Oct. 23, 2010, pp. 3139-3153, XP055499463.

Xia, J. et al., MetaboMiner—semi-automated identification of metabolites from 2D NMR spectra of complex biofluids, BMC Bioinformatics, Biomed Central, London, GB, vol. 9, No. 1, Nov. 28, 2008, p. 507, XP021041863.

Baek, H-M., et al., 2Hydroxyglutarate in Gliomas with IDH Gene Mutation Using High Resolution 1H-NMR Spectroscopy of Tissue Extracts, Proceedings of the International Society for Magnetic Resonance in Medicine, 20th Annual Meeting, May 5, 2012, p. 845, XP040623269.

Wider, G., et al., Measuring Protein Concentrations by NMR Spectroscopy, Journal of the American Chemical Society, 2006, vol. 128, pp. 2571-2576.

* cited by examiner

METHOD FOR AUTOMATICALLY QUANTIFYING AN ANALYTE, AND NMR MEASURING DEVICE FOR CARRYING OUT THE METHOD

This application is a 35 U.S.C. § 371 National Stage Application of PCT/EP2018/062715, filed on May 16, 2018, which claims the benefit of priority to Serial No. DE 10 2017 210 700.6, filed on Jun. 26, 2017 in Germany, the disclosures of which are incorporated herein by reference in their entirety.

BACKGROUND

The present disclosure relates to a method for the automated quantification of an analyte and to an NMR instrument having a nuclear magnetic resonance sensor, in particular a mobile, preferably handheld NMR instrument, for carrying out the method.

There is a large number of methods for quantifying analytes, especially in liquids, for example in the form of separation methods such as gas chromatography (GC) or high-performance liquid chromatography (HPLC), titration or similar. Such methods are, however, associated with substantial preparatory work and high use of solvents. Infrared spectroscopy makes it possible to detect a multiplicity of substances in a single sample. However, marked overlap of signals makes quantification possible only indirectly and relatively imprecisely. Moreover, in infrared spectroscopy matrix effects play a pivotal role, which means that the concentration ranges under examination are often inadequate for exact quantification of analytes in different liquids.

The quantification of analytes in liquids with the aid of nuclear magnetic resonance methods (hereinafter abbreviated to NMR) is already prior art. For example, DE 10 2014 203 721 A1 discloses a method for determining the concentration of a substance in a sample by nuclear magnetic resonance spectroscopy.

DE 10 2014 218 375 A1 and DE 10 2014 218 371 A1 disclose mobile NMR instruments having in each case a sensor device, wherein the sensor device includes at least an nuclear magnetic resonance sensor (NMR sensor) provided for the determination of a moisture value or for the detection and/or analysis and/or differentiation of material characteristics of a component under investigation.

SUMMARY

A method is proposed for the automated quantification of an analyte in a test sample, in particular in a liquid test sample, in particular by means of an NMR instrument. The method according to the disclosure is characterized by at least the following method steps:
  supplying a 1D-NMR spectrum, in particular one measured by means of an NMR sensor in the NMR instrument;
  supplying a 2D-NMR spectrum, in particular a JRES, HMBC, HSQC, COSY, and/or DOSY spectrum, in particular one measured by means of an NMR sensor in the NMR instrument;
  supplying at least one piece of information about at least one analyte to be quantified;
  determining a chemical shift (i.e. of the exact frequency in the Fourier-transform spectrum) of the NMR signal of the analyte to be quantified from the 2D-NMR spectrum on the basis of the at least one supplied piece of information;
  determining the expected peak positions (i.e. in particular frequency values in the Fourier-transform spectrum) of the NMR signal of the analyte to be quantified, in particular of a singlet and/or multiplet of the analyte to be quantified;
  determining the actual peak positions from the 1D-NMR spectrum;
  determining the peak positions of interfering signals on the basis of the expected peak positions and actual peak positions;
  modeling the 1D-NMR spectrum on the basis of the peak positions determined for the interfering signals, on the basis of the determined chemical shift and on the basis of the at least one supplied piece of information;
  integrating the modeled 1D-NMR spectrum, in particular after correcting for peaks due to interfering signals;
  quantifying the analyte through internal or external referencing.

In one embodiment of the method, the method steps may be carried out in the order shown. Alternatively, the order in which the method steps are carried out in the method according to the disclosure may instead deviate from the order described above.

In one embodiment of the method, the method is intended to be carried out by an NMR instrument or with the use of an NMR instrument. A corresponding NMR instrument, in particular a mobile, preferably handheld, NMR instrument, here has at least an NMR sensor (the terms "nuclear magnetic resonance sensor" and "NMR sensor" are used synonymously in this document), a control device for controlling the NMR instrument and for evaluating a measurement signal delivered by the nuclear magnetic resonance sensor, a display device for displaying the information determined, and a power supply device, in particular a battery. The NMR instrument, in particular its control device, is further provided and configured for use in carrying out the method according to the disclosure.

A "handheld NMR instrument" is understood here as meaning in particular that the NMR instrument may be transported using hands only, in particular using one hand, without the aid of a transport machine, and in particular may also be guided, in the course of a measurement, onto and/or along a test sample under investigation. The mass of the handheld instrument here is in particular less than 20 kg, advantageously less than 10 kg, and particularly advantageously less than 2 kg.

In one embodiment of a handheld NMR instrument, the components of the NMR instrument, in particular the NMR sensor, the control device and the power supply device of the NMR instrument, are at least partially housed in a housing of the NMR instrument. In particular, the components are housed in the housing of the NMR instrument to an extent of more than 50% of their total volume, preferably more than 75%, and more preferably 100%.

In one embodiment, the NMR instrument is realized as an energy-autonomous NMR instrument. "Energy-autonomous" is to be understood as meaning that the NMR instrument is for a brief time at least, preferably for at least the time taken to perform a measurement and an evaluation, able to be operated independently of the mains power supply, i.e. cordlessly. The NMR instrument has for this purpose an energy supply device in the form of an energy-storage unit independent of the mains power supply, in particular in the form of a battery, preferably in the form of a rechargeable battery. The power supply device is provided to supply the NMR instrument with electrical power for startup and during operation. The energy-storage unit independent of the mains power supply may in one embodiment be realized as a fuel cell, a capacitor, a hybrid supercapacitor or other energy-storage unit that appears expedient to those skilled in the art, or a combination/plurality thereof. Particularly suitable for powering the NMR instrument are batteries with cell chemistry that supplies high power density and/or energy density. A high power and/or energy density allows an improved power supply for the NMR instrument, i.e. one that is more long-lasting and tailored to the high power requirement of the NMR sensor. Examples currently include batteries based on lithium and lithium ion cell chemistry, in particular lithium iron phosphate, lithium manganese oxide, lithium nickel cobalt manganese oxide, overlithiated lithium-nickel-cobalt-manganese oxide, lithium sulfur, lithium polymer, and lithium-oxygen batteries.

"Provided" is to be understood as meaning in particular specifically "programmed", "designed", and/or "equipped". The description of an object as being "provided" for a particular function is to be understood as meaning in particular that the object fulfills and/or executes this particular function in at least one application mode and/or operating mode or is designed to fulfill the function.

The NMR instrument according to the disclosure has a control device for the control thereof. The control device is able to send/receive signals to/from the other components of the NMR instrument, in particular the NMR sensor, the display device, the power supply device, and also, for example, an input device and/or data communication interface. The control device is provided to communicate with these components during operation of the NMR instrument. "Control device" is to be understood as meaning in particular a device having at least control electronics, the means of communicating with the other components of the NMR instrument, for example means of controlling and/or regulating the NMR sensor, means of data processing, means of data storage and/or other means that appear expedient to those skilled in the art. In one embodiment, the control electronics of the control device are to be understood as meaning a processor unit that is connected to a memory unit and to an operating program saved in the memory unit that is executed during the control process. In particular, the electronic components of the control device may be arranged on a circuit board (printed circuit board), for example in the form of a microcontroller. The control device is additionally used for evaluating at least one measurement signal delivered by the NMR sensor, in particular for evaluating a 1D-NMR spectrum supplied by the NMR sensor and a 2D-NMR spectrum supplied by the NMR sensor, in particular a JRES, HMBC, HSQC, COSY, and/or DOSY spectrum. Alternatively or additionally, the measurement signal, in particular a 1D-NMR spectrum and a 2D-NMR spectrum, in particular a JRES, HMBC, HSQC, COSY, and/or DOSY spectrum, may also otherwise be supplied to the control device, for example using a data communication interface of the NMR instrument. "Provided for evaluating" means in particular that the control device has an information input for receiving measurement signals, in particular spectra, an information processing unit for processing, in particular evaluating measurement signals, in particular spectra, and an information display for communicating the processed and/or evaluated measurement signals, in particular the spectra, and/or evaluation results obtained. In one embodiment, the control device has components for this purpose that include at least a processor, a memory, and an operating program that has evaluation and calculation routines. In particular, these components may also be referred to as an evaluation device and/or designed as an evaluation device separate to the control device.

A "display device" of the NMR instrument is to be understood as meaning at least a means provided to display at least one alternating piece of information to an operator acoustically, optically and/or by touch. The display device is used to display to the operator of the NMR instrument at least the information obtained using the NMR instrument. In particular, the display device may be used to display a result for the quantification of the analyte. The display may take the form of, for example, a display screen, a touch-sensitive screen, an audible signal, a vibration generator, and/or an LED display. In one embodiment of the display device, the information may be displayed graphically or alphanumerically as the measurement result of the investigation. In one embodiment, the display device is housed in the housing of the handheld NMR instrument. Information or results to be displayed may additionally be forwarded to the control device and/or, particularly for greater user convenience, to a data processing system. The latter comprises at least an output of information to an external device such as a smartphone, a tablet, a PC or to a different external data device that appears expedient to those skilled in the art, which is connected to the NMR instrument via a data communication interface. In particular, the display device may be housed directly in the housing of the NMR instrument and may also be additionally augmented by external display devices. On the basis of the information displayed to a user of the NMR instrument by the display, it is possible for the user of the NMR instrument to obtain, after quantification of the analyte in the test sample, a result that may be understood intuitively.

For carrying out measurements, in particular for measuring a 1D-NMR spectrum and a 2D-NMR spectrum, in particular a JRES, HMBC, HSQC, COSY, and/or DOSY spectrum, the NMR instrument has at least one NMR sensor. The operating principle of the NMR sensor is based on the nuclear physics effect in which atomic nuclei in the test sample under investigation absorb and emit electromagnetic alternating fields in a first magnetic field designated $B_0$. The nuclear magnetic resonance is here based on the precession (Larmor precession) of nuclear spins of the atomic nuclei in the test sample under investigation about the magnetic field lines of the first, in particular constant and/or static, magnetic field. In particular, the nuclear spins of the atomic nuclei are aligned by the first magnetic field in a volume under investigation. If atomic nuclei resonating with the Larmor precession of their nuclear spins (energy quanta) are then irradiated with energy in the form of a second electromagnetic field, in particular an alternating field, for example a pulsed magnetic field, the atomic nuclei are able to change the orientation of their spins relative to the first magnetic field through absorption of this energy. The second incident magnetic field therefore serves to excite the nuclear spins, which change their nuclear spin states with the absorption of energy. At the same time, the emission of energy quanta resulting from a return from excited nuclear spins to another, lower energy level results in the emission of an electromagnetic alternating field, which can be observed by a device for detecting a magnetic field change, in particular by means of an antenna and/or a coil. The atomic nuclei are to be understood as meaning in particular protons (H) and other nuclear magnetic resonance-active nuclei such as 13C, 15N, 19F, 31P.

The NMR instrument according to the disclosure allows information to be determined from the NMR spectra obtained from the at least one NMR sensor, thus allowing information to be deduced about the properties and in particular the state of a test sample and in particular the concentration of analytes contained therein. For example, with appropriate evaluation of NMR spectra, information may be obtained about quality (for example of beverages, of fuels or of body fluids), the presence of constituents (for example harmful constituents, proscribed constituents, pesticides, fungicides, hormones, antibiotics), or similar. From this evaluated information, an operator of the NMR instrument is thus able to easily investigate and check properties such as quality, origin, authenticity, composition, hazard potential or similar in investigated test samples. In addition, the information obtained can be compared with the manufacturer's data and the authenticity of the manufacturer's data accordingly checked.

To carry out the measurement, the mobile NMR instrument, in particular the at least one NMR sensor, is brought close to the test sample under investigation or vice versa. The use of the instrument allows the test sample to be investigated without impairment, in particular without destruction, contamination or similar.

The mobile, energy-autonomous NMR instrument is a specialized instrument that has very limited functionality by comparison with scientific nuclear magnetic resonance instruments and is optimized for the analysis of a test sample. In particular, the control device with its evaluation routines is tailored to the performance of the method according to the disclosure. The NMR instrument may additionally be tailored to the evaluation of the information obtained and to the processed representation and display thereof by means of a display device. When the instrument is used to investigate a test sample, it processes the measurement results for the operator of the NMR instrument internally, immediately after the measurement, thus allowing in-situ quantification of an analyte in the test sample that is swift, unambiguous, and above all independent of other equipment such as computers or even of laboratories. Simple and intuitive operation of the instrument is advantageously achievable that requires no particular previous experience on the part of the operator.

The use of the handheld, energy-autonomous instrument that is specifically tailored for use in investigating test samples allows precise, comprehensive quantification of an analyte in a test sample in a swift and non-destructive, and hence particularly cost-effective, mobile determination that can be carried out in situ, for example in a warehouse, in a shop, in a wholesaler, during a patient visit, or similar.

"Quantification of an analyte in a test sample" is to be understood as meaning in particular the determination of a concentration of a substance, i.e. of an analyte, in the test sample, in particular a liquid test sample. In NMR spectroscopy, each analyte gives rise to one or more characteristic, frequency-dependent signals (NMR signals). The integrated intensity of the peaks produced by a particular analyte in a 1D-NMR spectrum is essentially proportional to the concentration of the associated analyte in the sample. Since each proton makes a defined contribution to the 1D-NMR spectrum, direct, exact quantification is possible. However, when a number of peaks overlap in a 1D-NMR spectrum it is often not straightforward to quantify the part of a signal that is associated with a particular substance. If more than one different analyte is present in the test sample and give rise to overlapping NMR signals, it can still be possible, with the aid of the line fitting technique, to express a group of signals as individual signals. This can accordingly permit quantification even when there is overlap of various signals.

"NMR signal" is in this document to be understood as meaning the physical signal of the test sample during an NMR measurement, independent of processing (for example Fourier transformation), that arises solely as the result of the chemical structure in the test sample.

In one embodiment of the method, the at least one analyte to be quantified is specified in a further method step. This allows the user of the method according to the disclosure to select the analyte to be quantified in accordance with his/her interest. In particular, the at least one analyte to be quantified may be specified through an input or selection by a user, for example by means of an input device or by selecting from a menu or by means of a barcode scanner (for example by scanning in a product-specific barcode) or similar. Alternatively, this information may instead be supplied to the computer unit or control device in a different manner, for example by reading from a memory. In one embodiment, the information about the at least one analyte to be quantified is static information, i.e. it is always the same analyte that is quantified in the method according to the disclosure.

By specifying the at least one analyte to be analyzed, it is possible for information processing, in particular the evaluation of spectra or similar, to be advantageously adapted to the analyte under investigation. For example, it is possible to select a reference database, depending on the specification. It is additionally possible, particularly in connection with the specification, to adapt an operating program to the control device, regulating routines, control routines, evaluation routines, and/or calculation routines.

In one step of the method according to the disclosure, a 1D-NMR spectrum is supplied. "Supplied" is hereinafter understood as meaning in particular that the computer unit that carries out the method according to the disclosure, in particular the control device of the NMR instrument, is supplied with corresponding information or a data set. Such a 1D-NMR spectrum is typically obtained when the nuclear spins present in an analyte are aligned in a strong, static magnetic field and energetically excited with a high-frequency pulse (i.e. the nuclear magnetization is rotated). The high-frequency response of the sample is then recorded as a function of time to obtain an FID (free induction decay) signal. Through Fourier transformation of the FID signal, a frequency spectrum for the sample is obtained in which characteristic peaks are present for the individual constituents of the sample and the individual peaks for the constituents overlap to a varying degree.

In one embodiment of the method, the analyte is quantified by means of 1H-NMR spectroscopy. 1H-NMR spectroscopy detects all substances that have a non-exchangeable proton, for example sugars, alcohols, organic acids and esters, aromatic substances such as aniline or vanillin, or similar. In one embodiment of the method, a 1 H-NMR spectrum without frequency suppression is supplied to allow quantification of main components such as water and/or alcohols. Alternatively, a 1H-NMR spectrum with selective signal suppression, in particular with solvent suppression, is supplied to allow quantification of analytes in very low concentrations.

In addition, in one step of the method according to the disclosure, a 2D-NMR spectrum, in particular a JRES, HMBC, HSQC, COSY, and/or DOSY spectrum, is supplied. Such a 2D-NMR spectrum is typically obtained when the nuclear spins present in an analyte are aligned in a strong, static magnetic field and energetically excited with a high-frequency pulse. A pulse sequence characteristic of the particular 2D-NMR spectrum with defined wait times between individual high-frequency pulses produces an exchange of magnetization between two or more nuclear spin-active nuclei. The high-frequency response of the sample is recorded as a function of time to obtain an FID signal. Through Fourier transformation, in particular double Fourier transformation, of the FID signal, a 2D-frequency spectrum for the sample may be obtained in which characteristic peaks are present for the individual constituents of the sample.

The 2D-NMR spectrum, for example a JRES spectrum, is used in the method according to the disclosure in order to be able to determine exactly a coupling constant and a chemical shift of analyte peaks in the supplied NMR signals, particularly in the supplied 1D-NMR spectrum. In particular, heteronuclear 2D-NMR spectra such as HMBC or HSQC may also be used for unambiguous assignment of the peaks. Information about couplings to heteronuclear nuclei such as 13C is used for this purpose.

In particular, these spectra, i.e. the 1D-NMR spectrum and the 2D-NMR spectrum, may be supplied to a computer unit that carries out the method according to the disclosure. In one embodiment, these spectra may be supplied to a control device of the NMR instrument according to the disclosure. In one embodiment, these spectra may be measured by means of the at least one NMR sensor of the NMR instrument according to the disclosure and supplied to the control device of the NMR instrument.

In one embodiment of the method, the 1D-NMR spectrum and the 2D-NMR spectrum are obtained under identical measurement conditions, in particular measured using the NMR sensor of the NMR instrument. This use of concordant measurement conditions allows particularly precise and reliable quantification to be carried out, since distortions or deviations in the spectra due to different measurement conditions can be avoided and thus excluded. The concordant measurement conditions relate in particular to the temperature of the test sample and/or solvent in the test sample and/or to the magnetic field strength of the static magnetic field in the respective measurement.

In one embodiment of the method, the spectra may be advantageously processed prior to further processing by known data-evaluation methods. For example, the 1D-NMR spectrum, or the Fourier-transformed FID spectrum as appropriate, may be premultiplied by a suitably chosen exponential function in order to obtain an improved signal-to-noise ratio. In addition, errors in the symmetry of spectra that can arise through homogeneity errors and phase errors may be reduced or eliminated by means of an automatically performed, so-called reference deconvolution method. The method may also include automatic phase correction and background correction (baseline correction) and also processing of the spectra by means of mathematical methods such as smoothing, filtering, averaging, or similar.

In a further method step of the method according to the disclosure, at least one piece of information about at least one analyte to be quantified is supplied. In particular, this information may be supplied to a computer unit that carries out the method according to the disclosure. In particular, this information may be supplied to the control device of the NMR instrument according to the disclosure. In one embodiment of the method, the at least one supplied piece of information specifies a chemical shift range, a number of evaluable signals, a multiplicity of evaluable signals, and/or a coupling constant of evaluable signals for the at least one analyte to be quantified. This allows the analyte to be quantified in a particularly simple, comprehensive, and precise manner. In particular, the information supplied may be used for the simple, comprehensive, and precise evaluation of the supplied 1D-NMR spectrum and/or of the supplied 2D-NMR spectrum. In one embodiment of the method according to the disclosure, the information supplied may additionally relate to the chemical shift range of carbon nuclei coupling to protons. This information is used for identification by means of a 2D-NMR spectrum and for the determination of the exact chemical shift.

The "chemical shift range" here states the approximate frequency range in which the analyte signal under investigation is to be expected in the supplied spectrum.

The "number of evaluable signals" is to be understood as meaning the number of signals that the analyte will give rise to in the spectrum. The number thus depends on the chemical structure of the analyte. In particular, the number of evaluable signals may be specified by preselecting the analyte to be quantified.

The "multiplicity" of the evaluable signals indicates the number of individual signals that result in an evaluable signal as the overall signal. The splitting of the overall signal into individual signals is caused by spin-spin coupling. The multiplicity of an evaluable signal depends on the chemical structure of the analyte. In particular, the "multiplicity" indicates the number of linearly independent states that the analyte can adopt in respect of spin orientation, i.e. the so-called spin multiplicity. The multiplicity is directly transferable to an NMR spectrum, in which the analyte gives rise to a signal in which the number of peaks corresponds to the multiplicity.

The "coupling constant of evaluable signals" is to be understood as meaning a constant that defines the strength of the interaction between two nuclei that couple to one another. Coupling constants are characteristic of a particular analyte. The coupling constant is used for identifying and for simulating/modeling the evaluable signals by means of a line-fitting algorithm.

In one embodiment of the method according to the disclosure, the at least one piece of information about the at least one analyte to be quantified is supplied by a database query. The at least one piece of information may thereby be saved in the instrument internally in a database on a memory unit, in particular on a memory unit of a computer unit or on the control device of the NMR instrument. In an alternative or additional embodiment, the at least one piece of information may also be saved in an external database, in particular one external to the instrument, that advantageously is continually updated. For example, the at least one piece of information may be saved in a database on a computer, on a server or on a different data storage unit and/or data processing device that appears expedient to those skilled in the art and be supplied therefrom when carrying out the method according to the disclosure. In particular, the at least one piece of information may also be supplied via internet access of the NMR instrument. Alternatively or additionally, the at least one piece of information may be saved internally, in particular internally within the NMR instrument, and may likewise be updated via internet access of the NMR instrument, for example by comparison with an external reference database.

In one method step, a chemical shift of the NMR signal of the analyte to be quantified is determined from the supplied 2D-NMR spectrum on the basis of the at least one supplied piece of information. This is done by determining from the 2D spectrum, in particular the JRES spectrum, the exact position of the peaks belonging to the analyte to be quantified. In one embodiment of the method, the starting point for the evaluation is here a chemical shift range that is characteristic of the analyte, i.e. already known. The at least one piece of information accessed here preferably specifies the chemical shift range. This allows minor deviations in chemical shift to be tolerated. On the basis of the starting parameters, the 2D-NMR spectrum is analyzed in respect of signals, i.e. peaks, that conform to the specified parameters, such as coupling constant, multiplicity or chemical shift of coupling 13C nuclei. If a peak matches the specified parameters from the database, the exact chemical shift of the peak is determined.

In this method step it is additionally possible to determine a coupling constant and a multiplicity of the analyte from the 2D-NMR spectrum, in particular from the JRES spectrum. The determined coupling constant and the determined multiplicity can then be compared with the at least one supplied piece of information, which can likewise relate to a coupling constant and a multiplicity of the analyte.

In one method step, expected peak positions of the NMR signal of the analyte to be quantified, in particular of a singlet and/or multiplet of the analyte to be quantified, are determined. In one embodiment of the method, the expected peak positions of the NMR signal of the analyte to be quantified, in particular of a singlet and/or multiplet of the analyte to be quantified, are calculated on the basis of the determined chemical shift and of the at least one supplied piece of information, in particular a supplied multiplicity of evaluable signals and a supplied coupling constant of evaluable signals. Depending on the multiplicity, this is done by calculating the chemical shift of the individual signals through the addition or subtraction of a defined frequency value from the determined chemical shift in accordance with the given coupling constants.

In an alternative or additional embodiment of the method, the expected peak positions of the NMR signal of the analyte to be quantified, in particular of a singlet and/or multiplet of the analyte to be quantified, are determined from the 2D-NMR spectrum, in particular from a JRES spectrum, on the basis of the determined chemical shift and the at least one supplied piece of information, in particular a supplied multiplicity of evaluable signals. The coupling constants of the NMR signal to be analyzed are determined from the 2D-NMR spectrum, in particular from the JRES spectrum, by determining the distances between the peak positions (so-called signal positions or central frequencies). Depending on the multiplicity, the chemical shift of the individual signals is calculated by adding or subtracting a defined frequency value from the determined chemical shift in accordance with the coupling constants determined from the 2D-NMR spectrum, in particular from the JRES spectrum.

In one method step, actual peak positions are determined from the supplied, in particular from the measured, 1D-NMR spectrum. Here, the peak positions of all peaks for which the intensity in the spectrum exceeds a given threshold are determined and saved to a buffer.

In one method step, peak positions of interfering signals are determined on the basis of the expected peak positions and actual peak positions. In one embodiment of the method, the peak positions of interfering signals are determined from a difference of the expected peak positions and the actual peak positions. "Peak positions of interfering signals" is to be understood as meaning, in particular, the peak positions of interfering signals that are overlapping with the desired spectrum and are not caused by the analyte under investigation. That is to say, the peak positions of interfering signals were not caused by the analyte under investigation.

In one method step, the 1D-NMR spectrum is modeled on the basis of the determined peak positions of interfering signals, on the basis of the determined chemical shift, and on the basis of the at least one supplied piece of information. In one embodiment of the method, the 1D-NMR spectrum is modeled by means of a line-fitting algorithm based on the determined peak positions of interfering signals and the determined chemical shift, with optimization of fit parameters for a Lorentzian to Gaussian distribution, for line width, for intensity, for a coupling constant, and for an influence of roof effects, wherein the peaks for interfering signals are modeled as singlets.

A "line-fitting algorithm" is to be understood as meaning an algorithm in which a calculated signal is fitted to a measured signal through iterations. In one embodiment, the fitting algorithm is executed for individual peak signals (for example, for resonance lines of methanol), but may also be extended to an entire spectrum with simultaneous inclusion of multiple signals produced by the analyte.

In a further method step, the modeled 1D-NMR spectrum is integrated, in particular after correction for peaks for interfering signals.

In one method step, the analyte is quantified by internal or external referencing. For internal referencing to be carried out, a suitable referencing reagent must be added to the test sample. Examples of typical referencing reagents are sodium trimethylsilylpropionate (TSP) for aqueous solutions or tetramethylsilane (TMS) for organic solutions.

External quantification can be carried out in particular by means of the established PULCON method. The PULCON method is described for example in G. Wider, L. Dreier, J. Am. Chem. Soc. 2006, No. 128, pp. 2571-2576.

In one embodiment of the method, the results of the quantification are further processed by means of a control device of the NMR instrument. In one embodiment of the method, a result may be displayed to an operator of the NMR instrument using a display device of the NMR instrument. In one embodiment of the method, the result of the quantification of the analyte is compared with a threshold value and the result of the comparison is displayed, in particular using the control device of the NMR instrument or using the computer unit carrying out the method. The result may here be displayed in particular by means of a display device of the NMR instrument.

Use of the method according to the disclosure allows a multiplicity of analytes in a liquid to be quantified rapidly, automatically, and precisely by NMR spectroscopy. The method here allows NMR spectroscopic data to be processed and evaluated in an advantageous manner that means that quantification of different analytes can be achieved with complete automation of the evaluation. The combination of data processing with the integration of information from various NMR data sets in particular the 1D-NMR spectrum and the 2D-NMR spectrum—permits quantification with the aid of a reliable algorithm for optimization of line fitting with the result that consistent accuracy is ensured. Use of the method according to the disclosure additionally allows the simultaneous quantification of a large number of analytes in one test sample. The result for each analyte to be quantified may advantageously be displayed as a concentration and associated measurement inaccuracy. Since there is no need for a trained specialist for evaluation of the measured data, this method can be implemented particularly advantageously in an NMR instrument that is conceived for use by untrained users.

BRIEF DESCRIPTION OF THE DRAWINGS

The disclosure is elucidated in more detail in the description hereinbelow with reference to working examples shown in the drawings. The drawing, the description, and the claims comprise numerous features in combination. Those skilled in the art will expediently also view the features individually and combine them into expedient further combinations. Identical or similar reference numbers in the figures indicate identical or similar elements.

DETAILED DESCRIPTION

Figure 1:
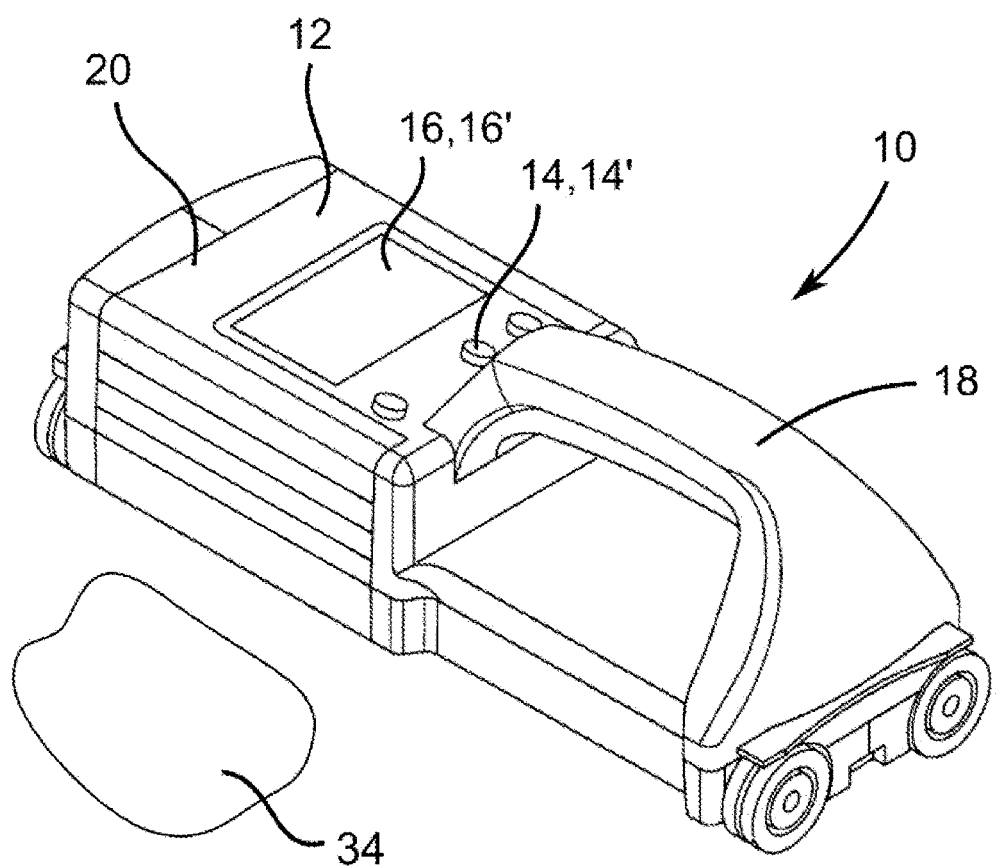
FIG. 1 shows a perspective representation of an embodiment of the mobile NMR instrument according to the disclosure.
Figure 1:
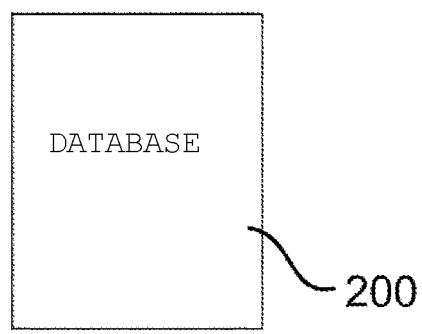
Figure 2:
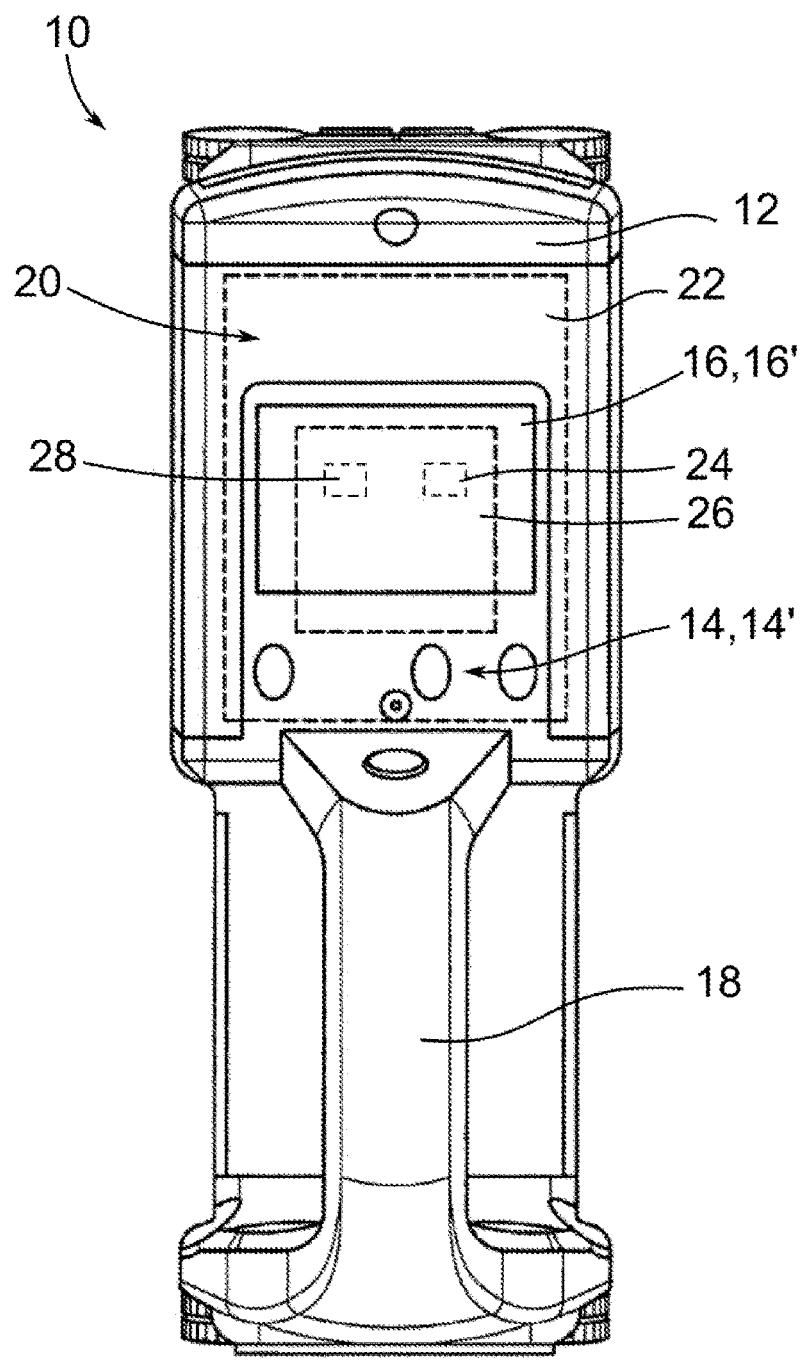
FIG. 2 shows a plan view of a first side of a housing in an embodiment of the NMR instrument according to the disclosure.

FIGS. 1 and 2 show two views of an exemplary embodiment of the handheld, energy-autonomous NMR instrument 10 according to the disclosure in a perspective representation and in a simplified, schematic plan view.

The exemplified NMR instrument 10 has a housing 12. The housing 12 accommodates an input device 14 in the form of actuating elements 14' suitable for switching the NMR instrument 10 on and off, for starting and configuring a measurement process, and for entering operating parameters. In addition, a display device 16 is provided in the housing 12 for displaying information determined and for displaying operating parameters in the form of a display screen 16'. The NMR instrument 10 has a handle 18 for the transport and guidance thereof. The handle 18, the actuating elements 14', and the display screen 16' are located on a first side of the housing 20 of the NMR instrument 10 (also "front"), which is typically facing the operator during operation of the NMR instrument.

For the power supply of the NMR instrument 10, there is a recess on the second side of the housing of the NMR instrument 10, at the back of the instrument on the side opposite to the first side of the housing 20 (not shown in detail here), that accommodates the mains-supply-independent energy-storage unit (not shown in detail here) in the form of rechargeable batteries. The mains-supply-independent energy-storage unit allows the NMR instrument 10 to be operated energy-autonomously, i.e. independently of the mains power supply and thus in particular also cordlessly, for a brief time at least. The exemplified NMR instrument 10 has lithium-ion batteries, the high energy density and power density of which is advantageously suitable for powering the NMR instrument 10. In an alternative embodiment, the energy-storage unit may also be accommodated in the handle 18 of the NMR instrument 10. The power supply device preferably has a releasable form-fitting connection or force-fitting connection interface, with result that the energy energy-storage unit (generally also more than one) can be arranged removably and replaceably. In addition, the energy storage in/outside the NMR instrument 10 may be supplied and charged with power from a mains power supply.

Accommodated on a carrier element 22, in particular a system board or printed circuit board inside the housing 12, are further components of the NMR instrument 10, in particular an NMR sensor 24, a control device 26 for controlling the NMR instrument 10 and for evaluating the measurement signals supplied by the NMR sensor 24, and also a data communication interface 28 connected to the control device 26 (see in particular FIG. 2). The control device 26 is used for the evaluation of at least one measurement signal supplied by the NMR sensor, in particular of a measured 1D-NMR spectrum 30 (see FIG. 4) and of a measured 2D-NMR spectrum 32 (see FIG. 5), in particular a JRES, HMBC, HSQC, COSY, and/or DOSY spectrum. Alternatively or additionally, the measurement signal, in particular a 1D-NMR spectrum 30 and a 2D-NMR spectrum 32, in particular a JRES, HMBC, HSQC, COSY, and/or DOSY spectrum, may also be otherwise supplied to the control device 26, for example using the data communication interface 28 of the NMR instrument 10. The control device 26 has control electronics comprising means of communicating with the other components of the NMR instrument 10, for example means for the control and regulation of the NMR sensor 24, of an evaluation device independent of the control device 26, or similar. The control device 26 comprises in particular a unit having a processor unit, a memory unit, and an operating program saved in the memory unit. The control device 26 is provided so that at least one operating parameter of the NMR instrument 10 may be adjusted as a function of at least one input from the operator, from an optionally provided evaluation device, and/or from the data communication interface 28. The control device 26 is further provided for carrying out the method according to the disclosure and has for this purpose a memory on which is saved an operating program that may be executed therefrom.

The NMR sensor 24 is provided for exciting nuclear magnetic resonance in atomic nuclei of the material in a test sample 34. The NMR sensor 24 is in particular provided for measuring a 1D-NMR spectrum 30 and a 2D-NMR spectrum 32, in particular a JRES, HMBC, HSQC, COSY, and/or DOSY spectrum of the test sample 34.

Figure 3:
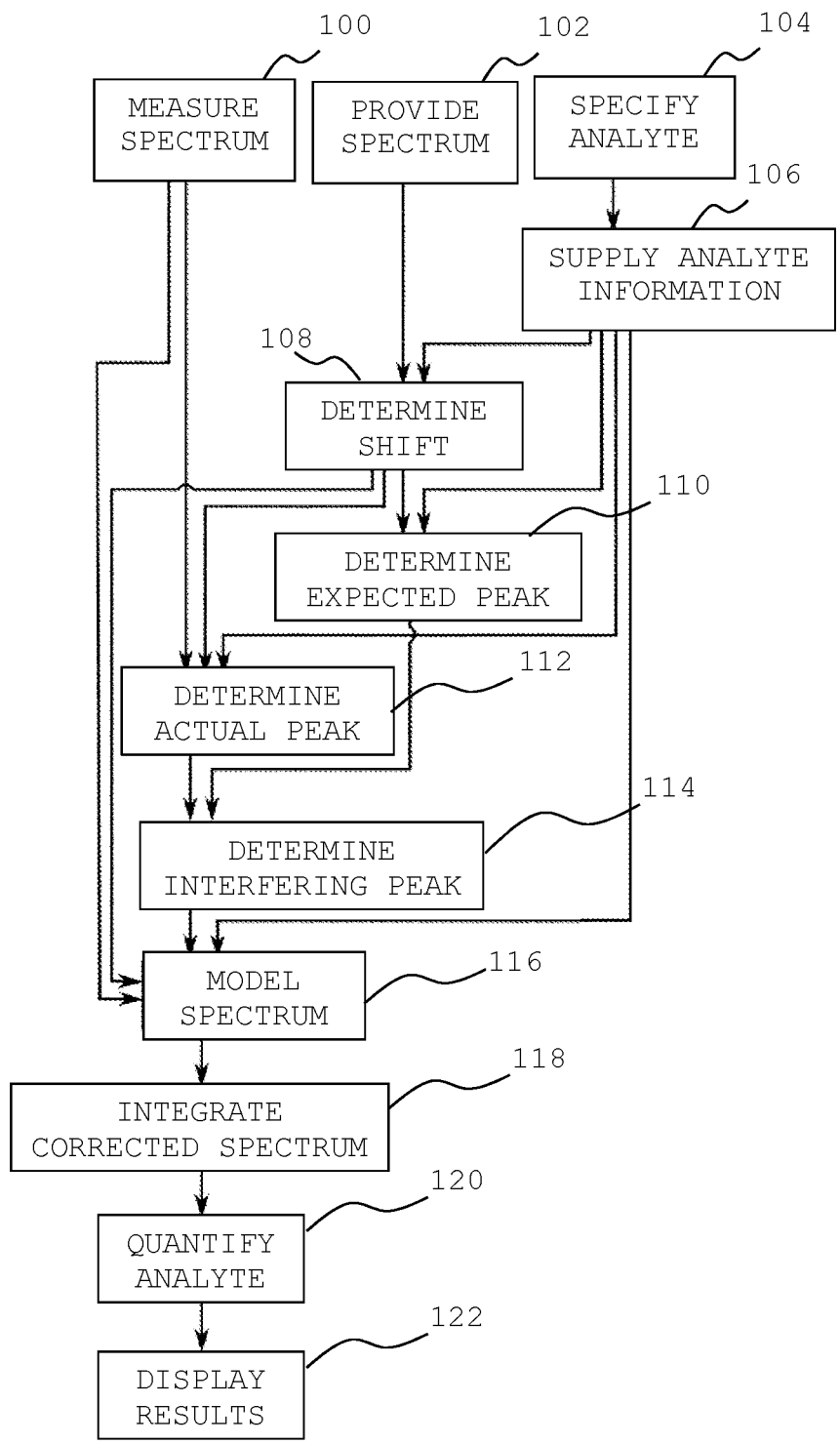
FIG. 3 shows a method flow diagram for an embodiment of the method according to the disclosure.

FIG. 3 shows a method diagram illustrating a working example of the method according to the disclosure for quantifying an analyte in a test sample 34, in particular in a liquid test sample, in particular by means of the NMR instrument 10.

Figure 4:
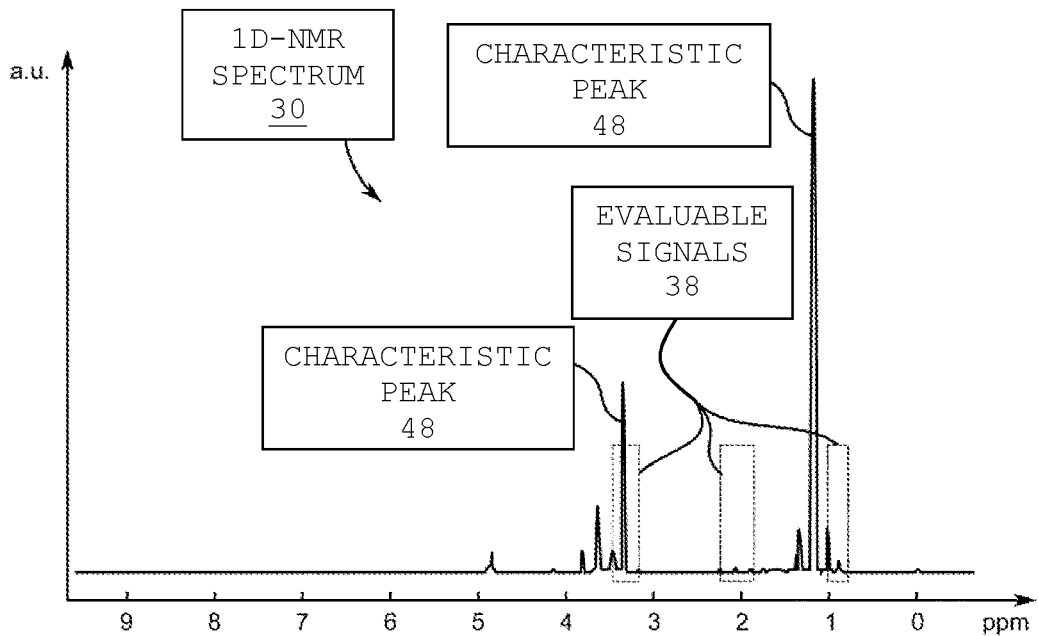
FIG. 4 shows an exemplary 1D-NMR spectrum.
Figure 5:
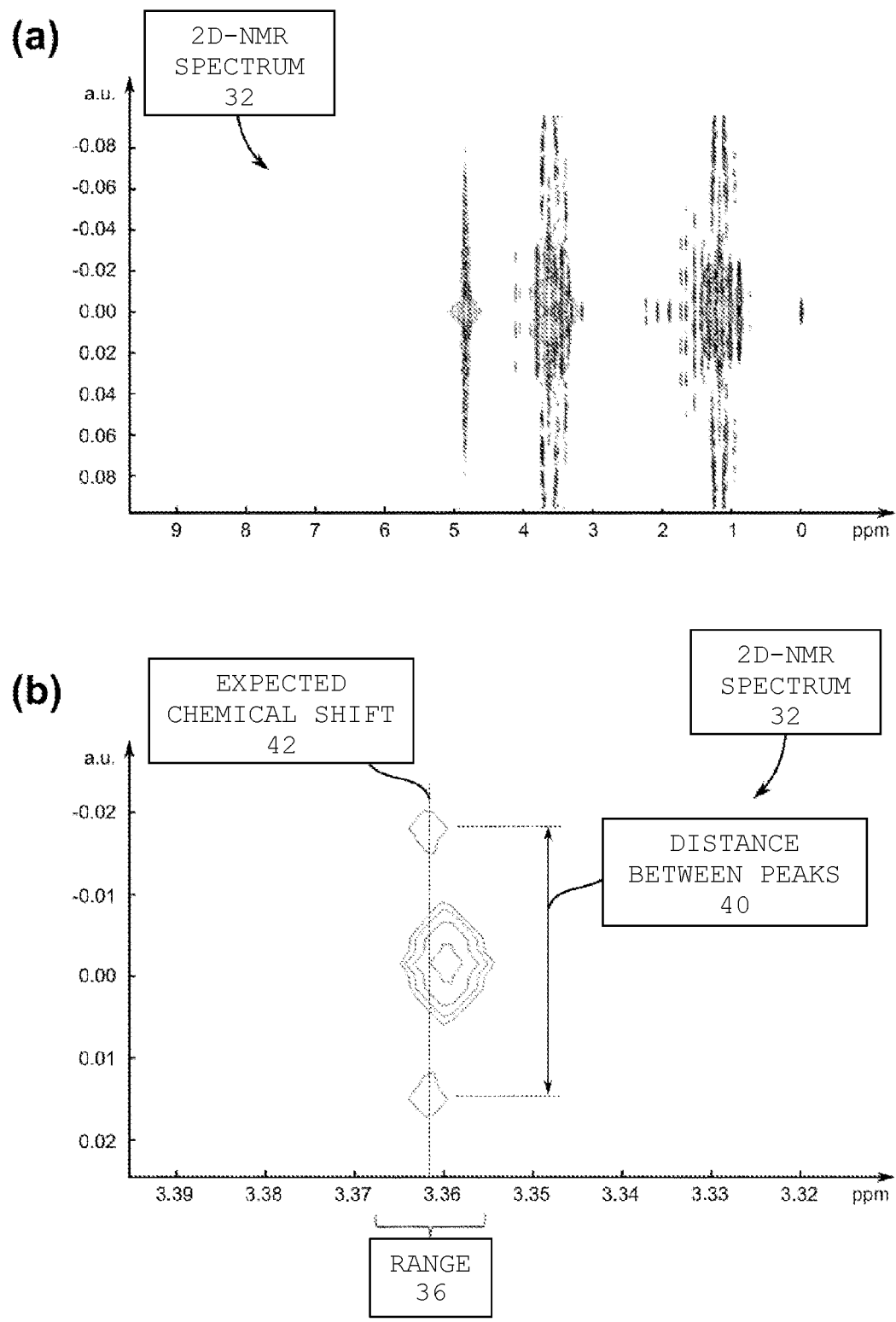
FIG. 5 shows an exemplary 2D-NMR spectrum plus an enlarged section of this 2D-NMR spectrum.

In method step 100, a 1D-NMR spectrum 30 measured by means of the NMR sensor 24 of the NMR instrument 10 is supplied. This 1D-NMR spectrum 30, in particular the data on which it was based, will already have been prepared for evaluation in method step 100, for example by smoothing, filtering or similar. An exemplary 1D-NMR spectrum 30 is shown in FIG. 4. The 1D-NMR spectrum 30 shows characteristic peaks 48 for the test sample 34, in particular for the analytes contained therein.

In method step 102, a 2D-NMR spectrum 32, in particular a JRES, HMBC, HSQC, COSY, and/or DOSY spectrum, measured by means of the NMR sensor 24 of the NMR instrument 10 is supplied. This 2D-NMR spectrum 32, in particular the data on which it was based, will likewise already have been prepared for evaluation in method step 102, for example by smoothing, filtering or similar. An exemplary 2D-NMR spectrum 32 is shown in FIG. 5*a*.

In method step 104, the at least one analyte to be quantified is specified, for example as a result of an input or selection by a user, for example by means of an input device 14 of the NMR instrument 10. In this working example, the user explicitly states the analyte to be quantified, for example by selecting the name of the analyte "alcohol" (for example, from a specified list).

In method step 106, information about the analyte to be quantified is supplied, based on the specified name of the analyte. The information here specifies at least a chemical shift range 36 (broad range of the expected chemical shift 42, represented by range 36 in FIG. 5) a number of evaluable signals 38 (in each case represented by a box in FIG. 4), a multiplicity of evaluable signals, and a coupling constant of evaluable signals for the analyte to be quantified. The multiplicity of evaluable signals and the coupling constant of evaluable signals are combined as reference number 40 in FIG. 5b, which shows an enlarged region of the 2D-NMR spectrum 32 shown in FIG. 5a. In the example shown in FIG. 5b, the multiplicity is 2 (doublet), the coupling constant is approximately 6.4 Hz (corresponding to the distance between the two peaks, indicated by reference number 40). The information about the at least one analyte to be quantified is supplied in this working example by a database query, in particular by means of an internet connection. The data retrieved from a database 200 (see FIG. 1) by means of the data communication interface 28 of the NMR instrument 10 are forwarded to the control device 26.

In method step 108, a chemical shift 42 of the NMR signal of the analyte to be quantified is determined from the 2D-NMR spectrum 32 on the basis of the at least one supplied piece of information. The data set of the 2D-NMR spectrum 32 is first searched, based on the chemical shift range 36 of the analyte, for a real signal with parameters that fit and the "actual" chemical shift 42 is determined therefrom. If no corresponding signal, i.e. a signal that can be evaluated on the basis of the chemical shift range 36, can be determined in the data set, a renewed query may be initiated for further information from the database 200. Alternatively, an error message or an instruction that a successful evaluation could not be carried out may be displayed to the user of the NMR instrument 10.

In method step 110, expected peak positions (not shown in detail here) of the NMR signal of the analyte to be quantified, in particular of a singlet and/or multiplet of the analyte to be quantified, are determined. In this working example, the expected peak positions of the NMR signal are calculated on the basis of the determined (i.e. actual) chemical shift 42 and the at least one supplied piece of information, in particular the supplied multiplicity of evaluable signals and the supplied coupling constant of evaluable signals (reference number 40). In addition, the expected peak positions of the NMR signal may also be determined from the 2D-NMR spectrum 32, in particular from a JRES spectrum, on the basis of the determined (actual) chemical shift 42 and the at least one supplied piece of information, in particular a supplied multiplicity of evaluable signals (40) (not shown in detail here).

Figure 6:
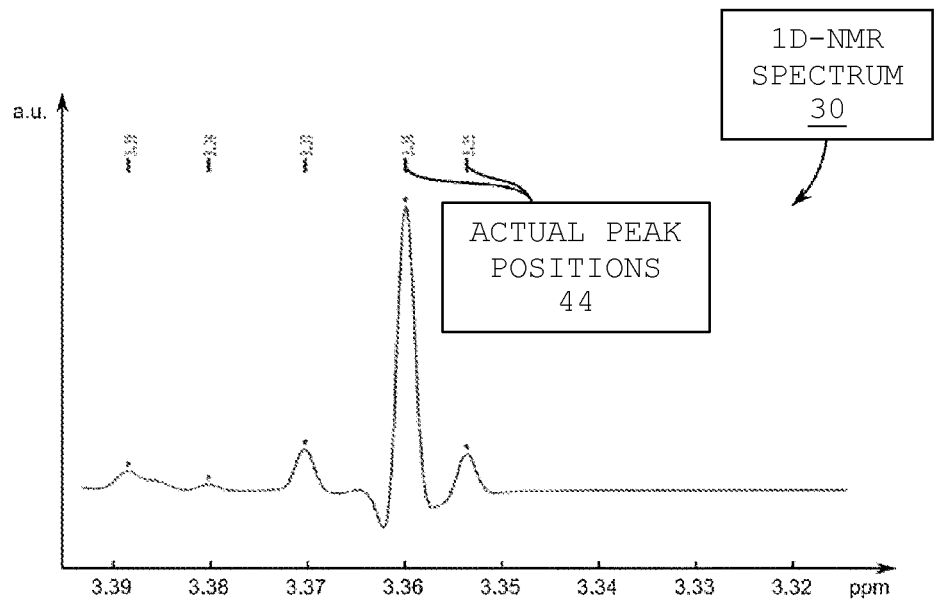
FIG. 6 shows an exemplary 1D-NMR spectrum after carrying out the method step of determining the actual peak positions.

In method step 112, actual peak positions 44 are determined from the 1D-NMR spectrum 30. This is done, for example, by analyzing the 1D-NMR spectrum 30 for local maxima. FIG. 6 shows an exemplary 1D-NMR spectrum in which the actual peak positions 44 are marked and shown with assigned values.

In method step 114, peak positions for interfering signals are determined on the basis of the expected peak positions and actual peak positions 44 from the difference of the expected peak positions and actual peak positions 44 (not shown in detail).

Figure 7:
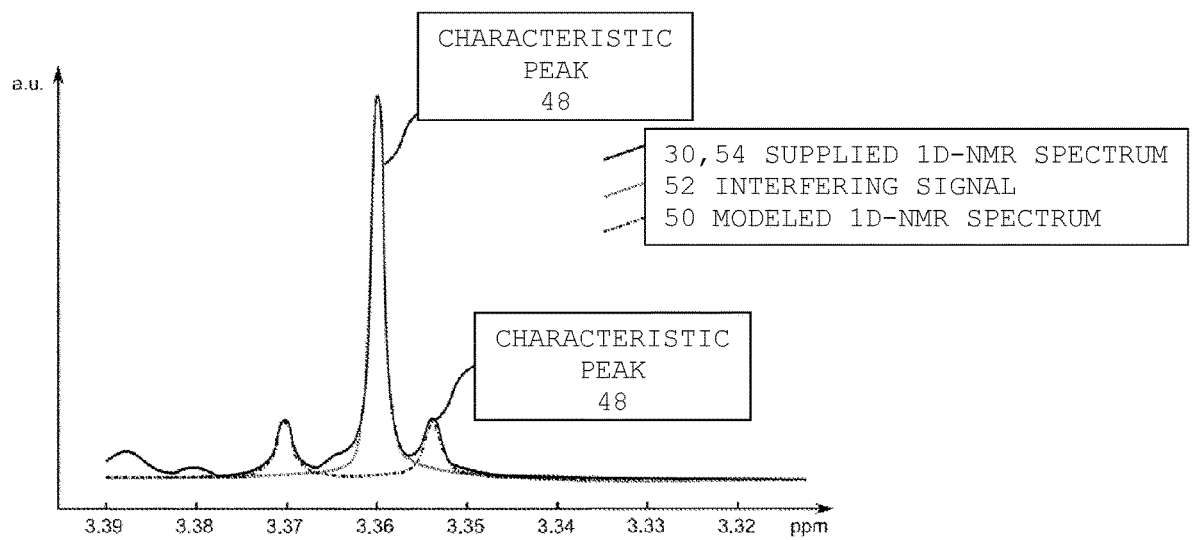
FIG. 7 shows an exemplary 1D-NMR spectrum after carrying out the line fitting method step.

In method step 116, the 1D-NMR spectrum 30 is then modeled on the basis of the determined peak positions of interfering signals, on the basis of the determined chemical shift 42, and on the basis of the at least one supplied piece of information. The modeling is carried out by means of a line-fitting algorithm based on the determined peak positions of interfering signals and the determined chemical shift 42 by optimization of fit parameters for a Lorentzian to Gaussian distribution, for line width, for intensity, for a coupling constant, and for an influence of roof effects, wherein the peaks for interfering signals are modeled as singlets. This gives rise to a clean, modeled 1D-NMR spectrum 50 that is corrected in particular for peaks due to interfering signals. FIG. 7 illustrates this, by way of example, with a section of a 1D-NMR spectrum 30 after/during performance of method step 116. In the exemplary data set, there is a doublet due to isobutanol (reference number 50)—the NMR signal to be quantified for the desired analyte—overlapping with an interfering signal 52 due to methanol (singlet). After performance of the line fitting algorithm, the supplied 1D-NMR spectrum 30 is described by the curve 54, which represents the modeled 1D-NMR spectrum 54. The desired NMR signal of the analyte to be quantified is represented by the modeled 1D-NMR spectrum 50 corrected for the interfering signal peak.

In method step 118, the modeled 1D-NMR spectrum 50 that is corrected in particular for peaks due to interfering signals is integrated.

In method step 120, the analyte is quantified by internal or external referencing. If more than one signal per analyte is present, an average value for the quantification value can be finally calculated (not shown in detail).

In method step 122, the results of the quantification are processed further by means of the control device 26 of the NMR instrument 10, in particular displayed to an operator of the NMR instrument 10 by means of the display device 16 of the NMR instrument 10. In this embodiment, a percentage value stating the concentration of the analyte in the test sample 34 is displayed. The result of the quantification of the analyte is additionally compared with a threshold value and the result of the comparison displayed by means of a colored LED (red, yellow, green) (not shown in detail).

The invention claimed is:

1. A method for the automated quantification of at least one analyte in a test sample using nuclear magnetic resonance (NMR), comprising:
   supplying, using an NMR sensor, a 1D-NMR spectrum to a control device;
   supplying, using the NMR sensor, a 2D-NMR spectrum to the control device;
   supplying at least one piece of information about the at least one analyte to be quantified to the control device;
   determining a chemical shift of an NMR signal of the at least one analyte to be quantified from the supplied 2D-NMR spectrum on the basis of the at least one supplied piece of information;
   determining expected peak positions of the NMR signal of the at least one analyte to be quantified;
   determining actual peak positions using the supplied 1D-NMR spectrum;
   determining peak positions of interfering signals on the basis of the expected peak positions and the actual peak positions;
   modeling the supplied 1D-NMR spectrum on the basis of
      (i) the peak positions determined for interfering signals,
      (ii) the determined chemical shift, and (iii) the at least one supplied piece of information;

integrating the modeled 1D-NMR spectrum; and
quantifying the at least one analyte through internal or external referencing using the integrated 1D-NMR spectrum.

2. The method as claimed in claim 1, further comprising: specifying the at least one analyte to be quantified.

3. The method as claimed in claim 1, wherein the at least one piece of information about the at least one analyte to be quantified is supplied by a database query.

4. The method as claimed in claim 1, wherein the at least one supplied piece of information specifies at least one of a chemical shift range, a number of evaluable signals, a multiplicity of evaluable signals, and a coupling constant of evaluable signals for the at least one analyte to be quantified.

5. The method as claimed in claim 1, wherein the determining of the expected peak positions of the NMR signal of the at least one analyte to be quantified includes calculating the expected peak positions on the basis of the determined chemical shift and the at least one supplied piece of information.

6. The method as claimed in claim 1, wherein the determining of the expected peak positions of the NMR signal of the at least one analyte to be quantified includes determining the expected peak positions from the supplied 2D-NMR spectrum on the basis of the determined chemical shift and the at least one supplied piece of information.

7. The method as claimed in claim 1, wherein the determination of the peak positions of the interfering signals includes determining the peak positions from a difference of the expected peak positions and the actual peak positions.

8. The method as claimed in claim 1, wherein the modeling of the supplied 1D-NMR spectrum includes using a line-fitting algorithm based on the determined peak positions of the interfering signals and the determined chemical shift by optimization of fit parameters for a Lorentzian to Gaussian distribution, for line width, for intensity, for a coupling constant, and for an influence of roof effects, wherein the peaks for the interfering signals are modeled as singlets.

9. The method as claimed in claim 1, further comprising: comparing a result of the quantification of the at least one analyte with a threshold value; and
displaying a result of the comparison.

10. The method as claimed in claim 1, wherein the test sample is a liquid test sample.

11. The method as claimed in claim 1, wherein the supplying of the 2D-NMR spectrum includes supplying at least one of a J-resolved (JRES) spectrum, heteronuclear multiple-bond correlation (HMBC) spectrum, heteronuclear single-quantum correlation (HSQC) spectrum, correlation spectroscopy (COSY) spectrum, and diffusion ordered spectroscopy (DOSY) spectrum.

12. The method as claimed in claim 1, wherein the determining of the expected peak positions of the NMR signal includes determining the expected peak positions of at least one of a singlet and a multiplet of the at least one analyte to be quantified.

13. The method as claimed in claim 1, further comprising: correcting for the peak positions of the interfering signals before integrating the modeled 1D-NMR spectrum.

14. The method as claimed in claim 5, wherein the at least one piece of supplied information used in the calculation of the expected peak positions includes a supplied multiplicity of evaluable signals and a supplied coupling constant of evaluable signals.

15. The method as claimed in claim 6, wherein the supplied 2D-NMR spectrum is a J-resolved (JRES) spectrum and the at least one supplied piece of information is a multiplicity of evaluable signals.

16. An NMR instrument comprising:
an NMR sensor;
a control device configured to control the NMR instrument and evaluate a measurement signal delivered by the NMR sensor by (i) determining a chemical shift of the NMR measurement signal associated with at least one analyte to be quantified using a 2D-NMR spectrum obtained from the measurement signal, and using at least one supplied piece of information about the at least one analyte to be quantified, (ii) determining expected peak positions of the NMR signal of the at least one analyte to be quantified, (iii) determining actual peak positions from a 1D-NMR spectrum obtained from the measurement signal, (iv) determining peak positions of interfering signals on the basis of the expected peak positions and the actual peak positions, (v) modeling the 1D-NMR spectrum on the basis of (a) the peak positions determined for interfering signals, (b) the determined chemical shift, and (c) the at leas one supplied piece of information, (vi) integrating the modeled 1D-NMR spectrum, and (vii) quantifying the analyte through internal or external referencing;
a display device configured to display the information determined; and
a power supply device.

17. The NMR instrument as claimed in claim 16, wherein the NMR instrument is a handheld NMR instrument and the power supply device includes a battery.

\* \* \* \* \*